(12) United States Patent
Swamy

(10) Patent No.: US 12,199,588 B2
(45) Date of Patent: *Jan. 14, 2025

(54) REFLECTIVE STRUCTURES FOR SURFACE ACOUSTIC WAVE DEVICES

(71) Applicant: Qorvo US, Inc., Greensboro, NC (US)

(72) Inventor: Manjunath Swamy, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/170,738

(22) Filed: Feb. 17, 2023

(65) Prior Publication Data
US 2023/0208386 A1  Jun. 29, 2023

Related U.S. Application Data

(63) Continuation of application No. 16/182,812, filed on Nov. 7, 2018, now Pat. No. 11,621,691.
(Continued)

(51) Int. Cl.
*H03H 9/02* (2006.01)
*H03H 9/145* (2006.01)
(Continued)

(52) U.S. Cl.
CPC ........ *H03H 9/02685* (2013.01); *H03H 9/145* (2013.01); *H03H 9/25* (2013.01); *H03H 9/725* (2013.01)

(58) Field of Classification Search
CPC ........... H03H 9/02637; H03H 9/02685; H03H 9/145; H03H 9/25; H03H 9/542; H03H 9/6436; H03H 9/725
(Continued)

(56) References Cited

U.S. PATENT DOCUMENTS 5,874,869 A    2/1999  Jeda et al.
8,138,858 B1 *  3/2012  Rao ...................... H03H 9/6459
                                                    333/195
(Continued)

OTHER PUBLICATIONS

Plessky, V.P., et al., "Reduced Passband Ladder Type SAW Impedance Element Filters on Strong Piezoelectric Substrates," Proceedings of the 1996 Ultrasonics Symposium, vol. 1, San Antonio, Texas, IEEE, pp. 11-14.
(Continued)

*Primary Examiner* — Tan H Trinh
(74) *Attorney, Agent, or Firm* — Withrow & Terranova, P.L.L.C.

(57) ABSTRACT

Interdigital transducer (IDT) and reflective structure arrangements for surface acoustic wave (SAW) devices are disclosed. Representative SAW devices are described herein with reduced overall size while maintaining good quality factors. In certain embodiments, a SAW device may include an IDT arranged between reflective structures on a piezoelectric material. The reflective structures may include reflective IDTs that are configured to have a phase difference with the IDT to reflect and confine acoustic waves in the piezoelectric material. In certain embodiments, the reflective structures may be electrically connected to at least one of an input signal or an output signal. In this manner, the reflective structures may be configured with reduced size as compared to conventional reflective structures such as gratings, thereby providing a SAW device with reduced dimensions without a negative impact on device performance.

21 Claims, 11 Drawing Sheets

Related U.S. Application Data

(60) Provisional application No. 62/698,515, filed on Jul. 16, 2018.

(51) Int. Cl.
*H03H 9/25* (2006.01)
*H03H 9/72* (2006.01)

(58) Field of Classification Search
USPC ........................................... 310/313
See application file for complete search history.

(56) References Cited

U.S. PATENT DOCUMENTS

| | | | | |
|---|---|---|---|---|
| 10,097,158 | B2* | 10/2018 | Kaneda | H03H 9/725 |
| 11,621,691 | B2* | 4/2023 | Swamy | H03H 9/02637 |
| | | | | 310/313 D |
| 2002/0079987 | A1 | 6/2002 | Yip et al. | |
| 2004/0080383 | A1 | 4/2004 | Takamine | |
| 2006/0214748 | A1 | 9/2006 | Funami et al. | |
| 2006/0244550 | A1* | 11/2006 | Inoue | H03H 9/0038 |
| | | | | 333/195 |
| 2006/0255884 | A1 | 11/2006 | Tanaka | |
| 2007/0194657 | A1 | 8/2007 | Morita et al. | |
| 2009/0085430 | A1 | 4/2009 | Andle et al. | |
| 2012/0062069 | A1 | 3/2012 | Yamanaka | |
| 2012/0062329 | A1 | 3/2012 | Yamanaka | |
| 2014/0049341 | A1 | 2/2014 | Komatsu et al. | |
| 2017/0012404 | A1 | 1/2017 | Xing et al. | |
| 2018/0102760 | A1 | 4/2018 | Inoue et al. | |
| 2018/0159495 | A1 | 6/2018 | Inoue et al. | |
| 2020/0284763 | A1 | 9/2020 | Lamothe et al. | |

OTHER PUBLICATIONS

Takeuchi, Masao, et al., "New Types of SAW Reflector and Resonator Consisting of Reflecting Elements with Alternative (Positive and Negative) Reflection Coefficients," Japanese Journal of Applied Physics, vol. 24, Supplement 24-1, 1985, pp. 145-147.
Non-Final Office Action for U.S. Appl. No. 16/182,812, mailed Jul. 13, 2022, 11 pages.
Notice of Allowance for U.S. Appl. No. 16/182,812, mailed Nov. 22, 2022, 6 pages.

* cited by examiner

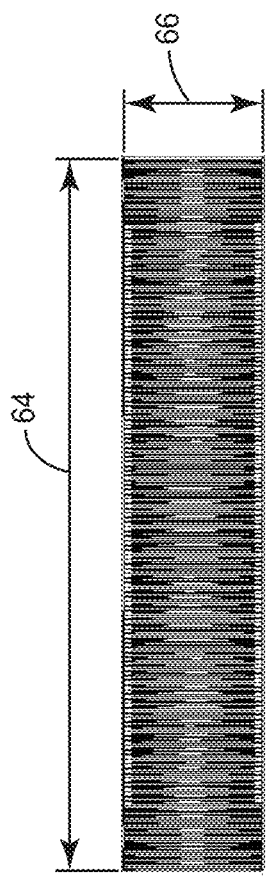
FIG. 7A
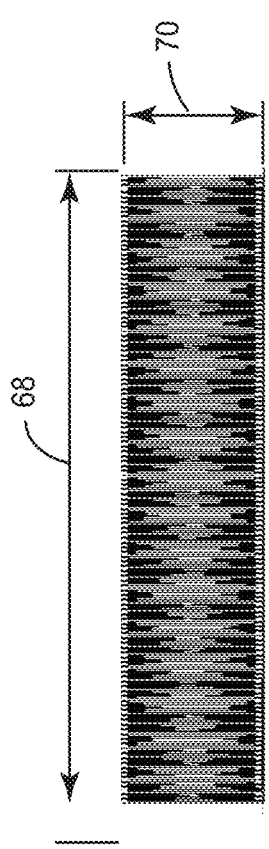
FIG. 7B
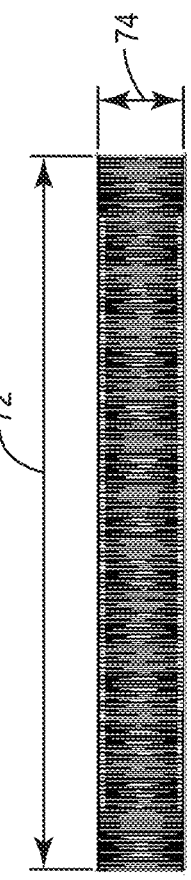
FIG. 7C
FIG. 7D
FIG. 7E
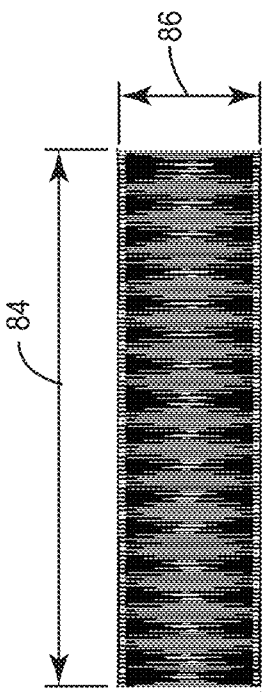
FIG. 7F

REFLECTIVE STRUCTURES FOR SURFACE ACOUSTIC WAVE DEVICES

RELATED APPLICATIONS

This application is a continuation of U.S. patent application Ser. No. 16/182,812, filed Nov. 7, 2018, now U.S. Pat. No. 11,621,691, and claims the benefit of provisional patent application Ser. No. 62/698,515, filed Jul. 16, 2018, the disclosures of which are hereby incorporated herein by reference in their entirety.

FIELD OF THE DISCLOSURE

The present disclosure relates to acoustic wave devices, and particularly to interdigital transducer (IDT) arrangements for surface acoustic wave (SAW) devices.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio frequency (RF) filters. For example, SAW filters are commonly used in second generation (2G), third generation (3G), and fourth generation (4G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As the use of SAW filters in modern RF communication systems and mobile devices increases, there is a need for SAW filters with good performance characteristics and reduced size.

SUMMARY

The present disclosure relates to acoustic wave devices, and particularly to interdigital transducer (IDT) and reflective structure arrangements for surface acoustic wave (SAW) devices. Representative SAW devices are described herein with reduced overall size while maintaining good quality factors. In certain embodiments, a SAW device may include an IDT arranged between reflective structures on a piezoelectric material. The reflective structures may include reflective IDTs that are configured to have a phase difference with the IDT to reflect and confine acoustic waves in the piezoelectric material. In certain embodiments, the reflective structures may be electrically connected to at least one of an input signal and an output signal. In this manner, the reflective structures may be configured with reduced size as compared to conventional reflective structures such as gratings, thereby providing a SAW device with reduced dimensions without a negative impact on device performance.

In one aspect, a SAW device comprises: a piezoelectric material; an interdigital transducer (IDT) on the piezoelectric material and electrically connected to an input signal and an output signal; and a first reflective structure and a second reflective structure on the piezoelectric material, wherein the IDT is arranged between the first reflective structure and the second reflective structure; wherein the first reflective structure comprises a first reflective IDT and the second reflective structure comprises a second reflective IDT. In certain embodiments, the first reflective IDT and the second reflective IDT comprise a phase difference with the IDT. The first reflective IDT and the second reflective IDT may be out of phase with the IDT. In certain embodiments, the first reflective IDT and the second reflective IDT are electrically connected to the input signal and the output signal. In other embodiments, the first reflective IDT and the second reflective IDT are electrically connected to ground and either the input signal or the output signal. In certain embodiments, the IDT comprises a plurality of first electrode fingers that are electrically connected to the input signal and a plurality of second electrode fingers that are electrically connected to the output signal, and the plurality of first electrode fingers are interdigitated with the plurality of second electrode fingers. The first reflective IDT may comprise one or more first reflective electrode fingers that electrically connected to the input signal and the second reflective IDT comprises one or more second reflective electrode fingers that electrically connected to the output signal. The one or more first reflective electrode fingers may be interdigitated with the one or more second reflective electrode fingers. In certain embodiments, a reflective electrode finger of the first reflective IDT is arranged closest to an electrode finger of the IDT and the reflective electrode finger and the electrode finger are both electrically connected to the same of either the input signal or the output signal. In certain embodiments, the SAW device may further comprise additional reflective structures, wherein the first reflective IDT and the second reflective IDT are configured between the additional reflective structures and the IDT. The additional reflective structures comprise reflective gratings, reflective IDTs, or both reflective gratings and reflective IDTs. In certain embodiments, at least one of the IDT, the first reflective IDT, and the second reflective IDT comprises an apodized IDT.

In another aspect, a SAW device comprises: a piezoelectric material; an interdigital transducer (IDT) on the piezoelectric material and electrically connected to an input signal and an output signal; and a first reflective structure and a second reflective structure on the piezoelectric material, wherein the IDT is arranged between the first reflective structure and the second reflective structure; wherein the first reflective structure and the second reflective structure are electrically connected to at least one of the input signal and the output signal. In certain embodiments, the first reflective structure and the second reflective structure are electrically connected to both of the input signal and the output signal. In other embodiments, the first reflective structure and the second reflective structure are electrically connected to ground and at least one of the input signal and the output signal. In certain embodiments, the first reflective structure and the second reflective structure comprise reflective IDTs that have a phase difference with the IDT. In certain embodiments, the first reflective structure and the second reflective structure comprise reflective IDTs that are out of phase with the IDT. In certain embodiments, a reflective electrode finger of the first reflective structure is arranged closest to an electrode finger of the IDT and the reflective electrode finger and the electrode finger are both electrically connected to the same of either the input signal or the output signal. The SAW device may further comprise additional reflective structures, wherein the first reflective structure and the second reflective structure are configured between the additional reflective structures and the IDT. The additional reflective structures comprise reflective gratings, reflective IDTs, or both reflective gratings and reflective IDTs.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 7A is a top view illustration of the TX2 resonator of FIGS. 5A and 6A.

FIG. 7B is a top view illustration of the TX2' resonator of FIGS. 5B and 6B.

FIG. 7C is a top view illustration of the TX4 resonator of FIGS. 5A and 6A.

FIG. 7D is a top view illustration of the TX4' resonator of FIGS. 5B and 6B.

FIG. 7E is a top view illustration of the TX6 resonator of FIGS. 5A and 6A.

FIG. 7F is a top view illustration of the TX6' resonator of FIGS. 5B and 6B.

DETAILED DESCRIPTION

Figure 1:
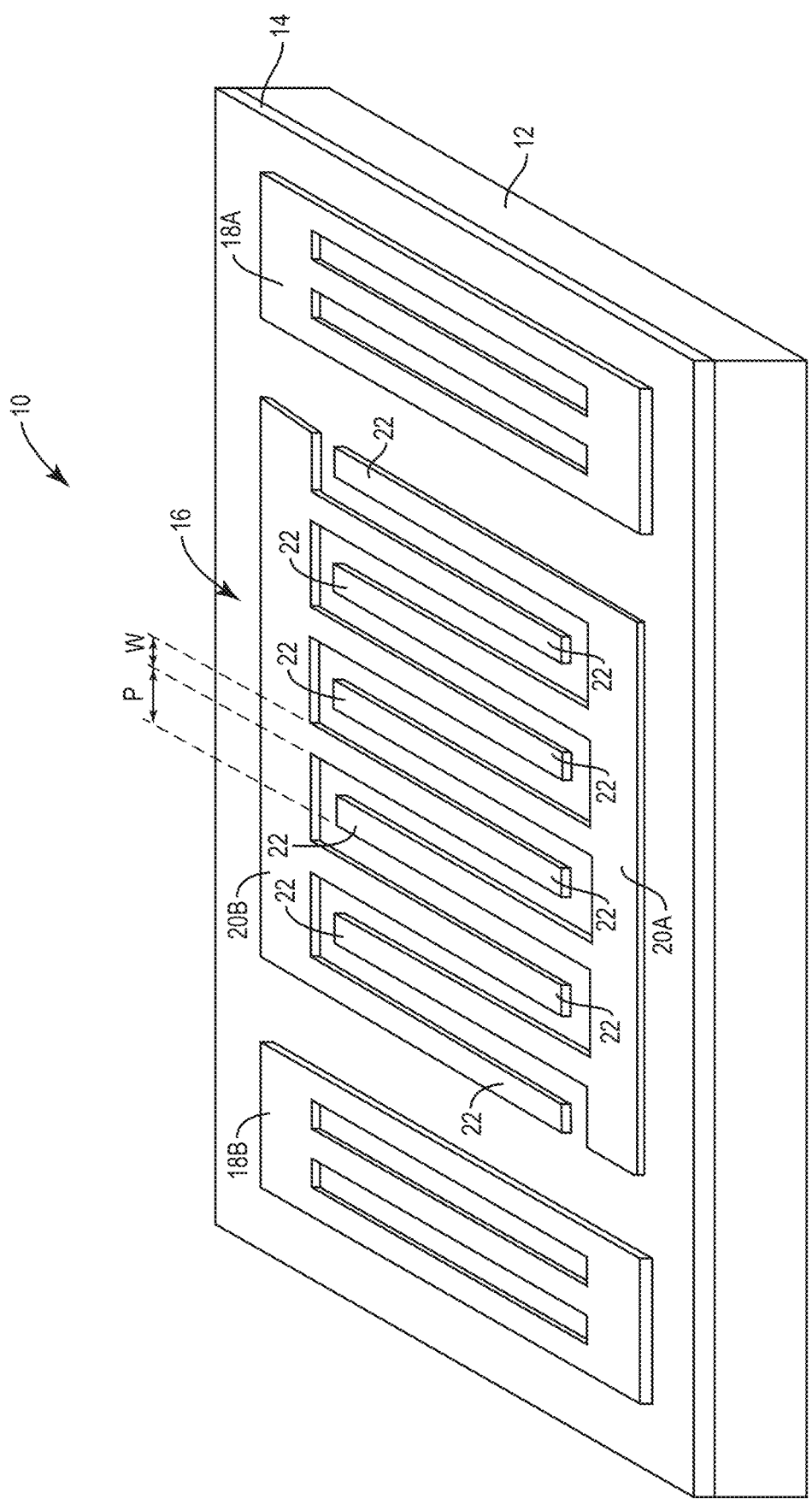
FIG. 1 is a perspective view illustration of a representative surface acoustic wave (SAW) device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to acoustic wave devices, and particularly to interdigital transducer (IDT) and reflective structure arrangements for surface acoustic wave (SAW) devices. Representative SAW devices are described herein with reduced overall size while maintaining good quality factors. In certain embodiments, a SAW device may include an IDT arranged between reflective structures on a piezoelectric material. The reflective structures may include reflective IDTs that are configured to have a phase difference with the IDT to reflect and confine acoustic waves in the piezoelectric material. In certain embodiments, the reflective structures may be electrically connected to at least one of an input signal and an output signal. In this manner, the reflective structures may be configured with reduced size as compared to conventional reflective structures such as gratings, thereby providing a SAW device with reduced dimensions without a negative impact on device performance.

Before describing particular embodiments of the present disclosure further, a general discussion of SAW devices is provided. FIG. 1 is a perspective view illustration of a representative SAW device 10. The SAW device 10 includes a substrate 12, a piezoelectric layer 14 on the substrate 12, an IDT 16 on a surface of the piezoelectric layer 14 opposite the substrate 12, a first reflector structure 18A on the surface of the piezoelectric layer 14 adjacent to the IDT 16, and a second reflector structure 18B on the surface of the piezoelectric layer 14 adjacent to the IDT 16 opposite the first reflector structure 18A.

The IDT 16 includes a first electrode 20A and a second electrode 20B, each of which include a number of electrode fingers 22 that are interleaved with one another as shown. The first electrode 20A and the second electrode 20B may also be referred to as comb electrodes. A lateral distance between adjacent electrode fingers 22 of the first electrode 20A and the second electrode 20B defines an electrode pitch P of the IDT 16. The electrode pitch P may at least partially define a center frequency wavelength λ of the SAW device 10, where the center frequency is the primary frequency of mechanical waves generated in the piezoelectric layer 14 by the IDT 16. For a single electrode IDT 16 such as the one shown in FIG. 1, the center frequency wavelength λ is equal to twice the electrode pitch P. For a double electrode IDT 16, the center frequency wavelength λ is equal to four times the electrode pitch P. A finger width W of the adjacent electrode fingers 22 over the electrode pitch P may define a metallization ratio, or duty factor, of the IDT 16, which may dictate certain operating characteristics of the SAW device 10.

In operation, an alternating electrical input signal provided at the first electrode 20A is transduced into a mechanical signal in the piezoelectric layer 14, resulting in one or more acoustic waves therein. In the case of the SAW device 10, the resulting acoustic waves are predominately surface acoustic waves. As discussed above, due to the electrode pitch P and the metallization ratio of the IDT 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in the impedance and/or a phase shift between the first electrode 20A and the second electrode 20B with respect to the frequency of the alternating electrical input signal. An alternating electrical potential between the two electrodes 20A and 20B creates an electrical field in the piezoelectric layer 14 which generate acoustic waves. The acoustic waves travel at the surface and eventually are transferred back into an electrical signal between the electrodes 20A and 20B. The first reflector structure 18A and the second reflector structure 18B reflect the acoustic waves in the piezoelectric layer 14 back towards the IDT 16 to confine the acoustic waves in the area surrounding the IDT 16.

The substrate 12 may comprise various materials including glass, sapphire, quartz, silicon (Si), or gallium arsenide (GaAs) among others, with Si being a common choice. The piezoelectric layer 14 may be formed of any suitable piezoelectric material(s). In certain embodiments described herein, the piezoelectric layer 14 is formed of lithium tantalate (LT), or lithium niobate ($LiNbO_3$), but is not limited thereto. In certain embodiments, the piezoelectric layer 14 is thick enough or rigid enough to function as a piezoelectric substrate. Accordingly, the substrate 12 in FIG. 1 may be omitted. Those skilled in the art will appreciate that the principles of the present disclosure may apply to other materials for the substrate 12 and the piezoelectric layer 14. The IDT 16, the first reflector structure 18A, and the second reflector structure 18B may comprise any metal or metal alloy. While not shown to avoid obscuring the drawings, additional passivation layers, frequency trimming layers, or any other layers may be provided over all or a portion of the exposed surface of the piezoelectric layer 14, the IDT 16, the first reflector structure 18A, and the second reflector structure 18B. Further, one or more layers may be provided between the substrate 12 and the piezoelectric layer 14 in various embodiments.

Figure 2A:
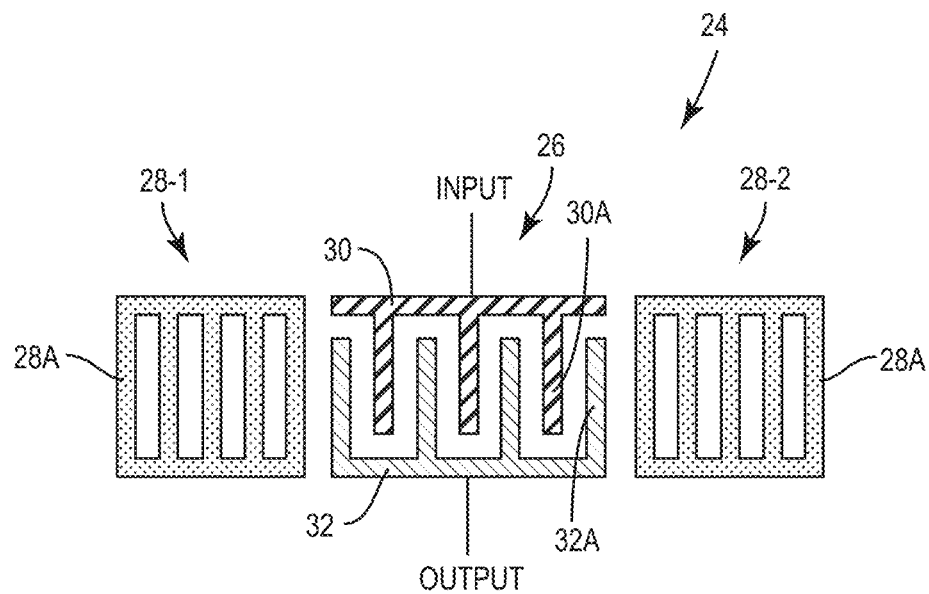
FIG. 2A illustrates an example SAW structure that includes an interdigital transducer (IDT) arranged between two reflective structures.
Figure 2B:
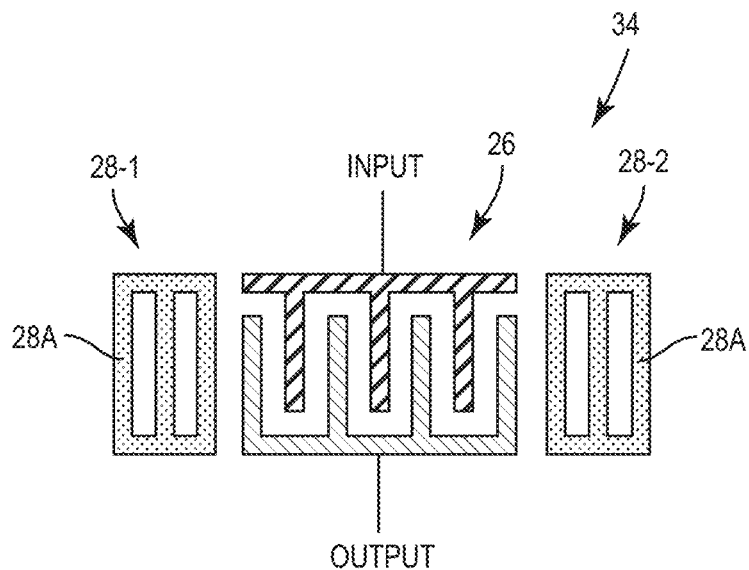
FIG. 2B illustrates an alternative configuration of a SAW structure where an IDT is configured between two reflective structures and a number of reflective fingers within each of the two reflective structures is reduced.

FIG. 2A illustrates an example SAW structure 24 that includes an IDT 26 arranged between two reflective structures 28-1, 28-2. An optional substrate (e.g., 12 of FIG. 1) and/or piezoelectric layer or substrate (e.g., 14 of FIG. 1) are not shown. The IDT 26 comprises a first electrode 30 that is electrically connected to an input signal and a second electrode 32 that is electrically connected to an output signal. The first electrode 30 comprises a plurality of first electrode fingers 30A that are interdigitated with a plurality of second electrode fingers 32A of the second electrode 32. As previously described, the pitch between the first electrode fingers 30A and the second electrode fingers 32A is about equal to a center frequency wavelength λ for the SAW structure 24. While only a certain number of first and second electrode fingers 30A, 32A are illustrated, in practice the IDT 26 can include many more alternating first and second electrode fingers 30A, 32A. Additionally, each of the reflective structures 28-1, 28-2 comprises a plurality of reflective fingers 28A that may be electrically shorted to one another within each of the respective reflective structures 28-1, 28-2. In other configurations, the reflective fingers 28A may be electrically open to one another. A pitch of the reflective fingers 28A within each of the reflective structures 28-1, 28-2 may be configured similar to the pitch between the first electrode fingers 30A and the second electrode fingers 32A of the IDT 26. In this manner, reflections from individual ones of the reflective fingers 28A are in phase for a desired frequency within a resonant cavity between the two reflective structures 28-1, 28-2. In operation, a certain number of the reflective fingers 28A are required to provide adequate confinement within the SAW structure 24. FIG. 2B illustrates an alternative configuration of an example SAW structure 34 where the IDT 26 is configured between the two reflective structures 28-1, 28-2 and the number of reflective fingers 28A within each of the two reflective structures 28-1, 28-2 is reduced. In FIG. 2B, the number of the reflective fingers 28A are reduced to three reflective fingers 28A in each of the reflective structures 28-1, 28-2 (from five reflective fingers 28A in FIG. 2A) for illustrative purposes. In this manner, the alternative configuration of the SAW structure 34 in FIG. 2B has reduced sized when compared with FIG. 2A; however, device performance may be compromised. In operation, if the number of the reflective fingers 28A is too low, a quality factor (Q factor) of the SAW structure 34 may be too low, indicating a high rate of energy loss. As configured in FIGS. 2A and 2B, the reflective structures 28-1, 28-1 may also be referred to as gratings, or grating reflectors.

According to embodiments disclosed herein, a SAW device may comprise a piezoelectric material, an IDT on the piezoelectric material and electrically connected to an input signal and an output signal, and a first reflective structure and a second reflective structure on the piezoelectric material, wherein the IDT is arranged between the first reflective structure and the second reflective structure. The first reflective structure may comprise a first reflective IDT and the second reflective structure may comprise a second reflective IDT. In certain embodiments, the first reflective IDT and the second reflective IDT are configured to have a phase difference or be out of phase with the IDT in order to provide a resonant cavity with adequate confinement. In this manner, the first reflective IDT and the second reflective IDT can achieve similar reflection characteristics as larger conventional reflective structures, thereby providing a SAW device with decreased dimensions without a decrease in performance characteristics, such as Q factor.

Figure 3A:
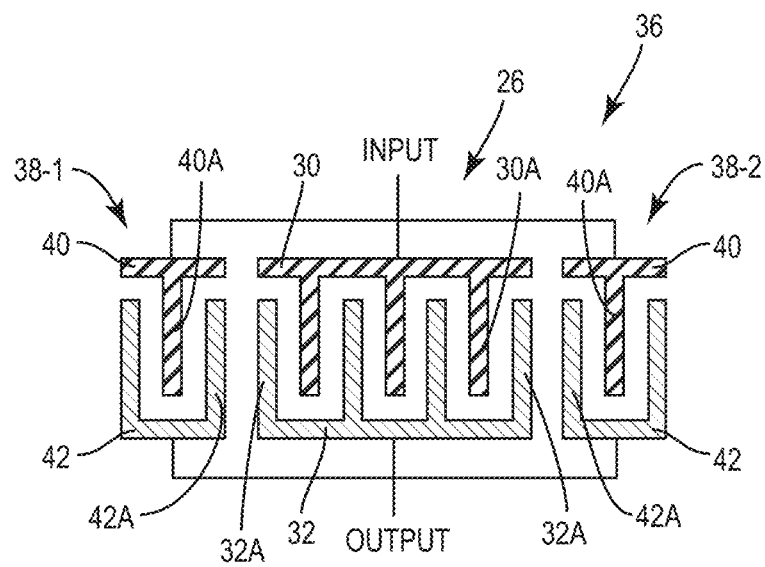
FIG. 3A illustrates a SAW structure that includes first and second reflective structures that comprise reflective IDTs that have a phase difference with an IDT according to embodiments disclosed herein.
Figure 3B:
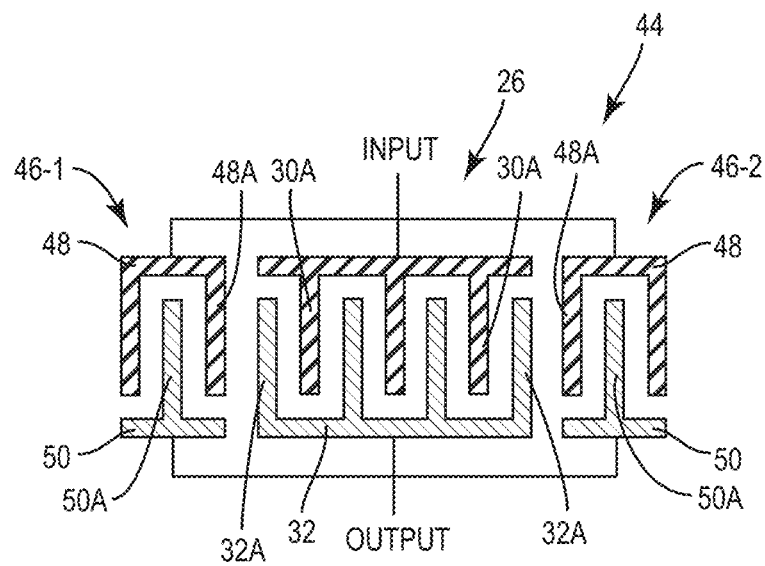
FIG. 3B illustrates a SAW structure that includes an IDT arranged between additional IDTs that are configured to be in phase with the IDT.

FIG. 3A illustrates a SAW structure 36 that includes first and second reflective structures 38-1, 38-2 that comprise reflective IDTs that have a phase difference with the IDT 26 according to embodiments disclosed herein. An optional substrate (e.g., 12 of FIG. 1) and/or piezoelectric layer or substrate (e.g., 14 of FIG. 1) are not shown, but may be provided to form a SAW device. In FIG. 3A, the SAW structure 36 includes the IDT 26 with the first electrode 30 that is electrically connected to the input signal and the second electrode 32 that is electrically connected the output signal as previously described. The first electrode 30 comprises the plurality of first electrode fingers 30A that are interdigitated with the plurality of second electrode fingers 32A of the second electrode 32. In this manner the plurality of first electrode fingers 30A that are electrically connected to the input signal are alternated with the plurality of second electrode fingers 32A that are electrically connected to the output signal to generate acoustic waves in response to an electrical signal as previously described. While only a certain number of the first and second electrode fingers 30A, 32A are illustrated, in practice the IDT 26 can include many more alternating first and second electrode fingers 30A, 32A. Each of the reflective structures 38-1, 38-2 comprises a first reflective electrode 40 that is electrically connected to the input signal and a second reflective electrode 42 that is electrically connected to the output signal. The first reflective electrode 40 includes one or more first reflective electrode fingers 40A, and the second reflective electrode 40 includes one or more second reflective electrode fingers 42A. The one or more first reflective electrode fingers 40A are alternated or interdigitated with the one or more second reflective electrode fingers 42A to form reflective IDTs. As illustrated in FIG. 3A, the IDT 26 is arranged between the first reflective structure 38-1 and the second reflective structure 38-2 such that an individual second reflective electrode finger 42A is arranged closest to an individual second electrode finger 32A of the IDT 26, both of which are electrically connected to the output signal. In this manner, the alternating arrangement of electrode fingers 30A, 32A is interrupted by the reflective IDTs of the reflective structures 38-1, 38-2. The reflective IDTs are thereby configured to have a phase difference with the IDT 26 and accordingly, acoustic waves are reflected and confined within a resonant cavity that is formed between the reflective structures 38-1, 38-2 on the piezoelectric material. In certain embodiments, the reflective IDTs are configured to be out of phase with the IDT 26. Additionally, as the first reflective electrode 40 of each reflective structure 38-1, 38-2 is electrically connected to the input signal and the second reflective electrode 42 of each reflective structure 38-1, 38-2 is electrically connected to the output signal, the reflective structures 38-1, 38-2 may also serve as IDT capacitors that may alter the overall static capacitance. In other embodiments, the individual second reflective electrode finger 42A is arranged closest to the individual second electrode finger 32A, and both may be electrically connected to the input signal to form reflective IDTs as previously described. Accordingly, a SAW device may include a reflective electrode finger of a reflective IDT that is arranged closest to an electrode finger of an IDT, and the reflective electrode finger and the electrode finger are both electrically connected to the same of either the input signal or the output signal. In contrast to the SAW structure 36 of FIG. 3A, FIG. 3B illustrates a SAW structure 44 that includes the IDT 26 as previously described arranged between additional IDTs 46-1, 46-2 that are configured to be in phase with the IDT 26. Each of the additional IDTs 46-1, 46-2 comprises a first electrode 48 with one or more first electrode fingers 48A electrically connected with an input signal and a second electrode 50 with one or more second electrode fingers 50A electrically connected with an output signal. The first electrode fingers 48A and second electrode fingers 50A of the additional IDTs 46-1, 46-2 are arranged in an alternating manner that continues with the electrode fingers 30A, 32A of the IDT 26. In this manner, the additional IDTs 46-1, 46-2 are configured to be in phase with the IDT 26 and therefore do not serve to reflect and confine acoustic waves.

Figure 4A:
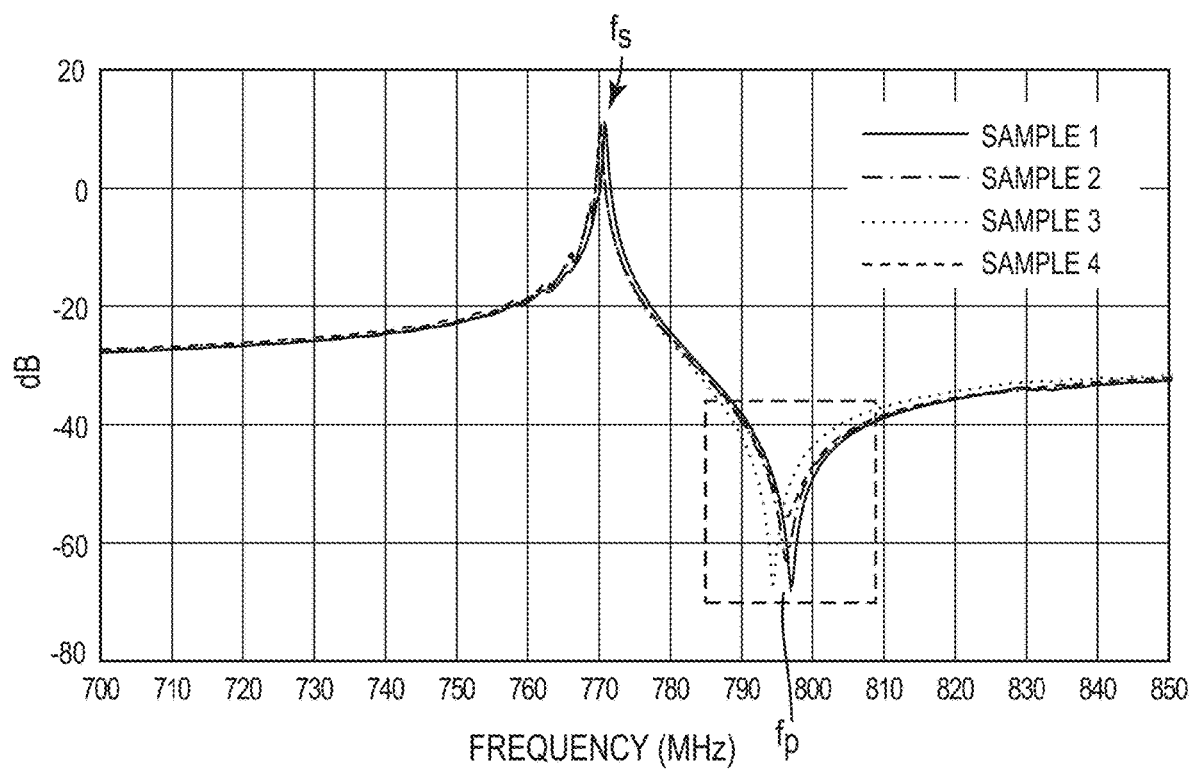
FIG. 4A is a graph plotting the admittance of four SAW devices with varying reflective structures.
Figure 4B:
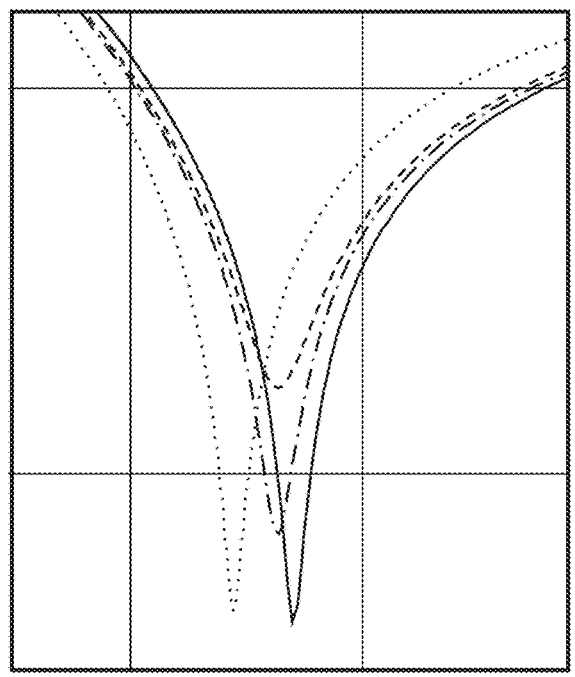
FIG. 4B illustrates a zoomed in view of the dashed box of FIG. 4A where parallel resonant frequencies of the four SAW devices differ.

FIG. 4A is a graph plotting the admittance of four SAW devices with varying reflective structures. All of the four SAW devices, SAMPLES 1-4, are configured with a same IDT configured with a same center frequency wavelength $\lambda$. SAMPLE 1 is a SAW device that includes a structure similar to the SAW structure 24 of FIG. 2A with an IDT (e.g., 26 of FIG. 2A) length of about 112$\lambda$ and a reflective structure (e.g., 28-1, 28-2 of FIG. 2A) length of about 14$\lambda$. SAMPLE 2 is a SAW device that includes a structure similar to the SAW structure 34 of FIG. 2B with an IDT (e.g., 26 of FIG. 2B) length of about 112$\lambda$ and a reflective structure (e.g., 28-1, 28-2 of FIG. 2B) length of about 3$\lambda$. SAMPLE 3 is a SAW device that includes a structure similar to the SAW structure 36 of FIG. 3A with an IDT (e.g., 26 of FIG. 3A) length of about 112$\lambda$ and a reflective structure (e.g., 38-1, 38-2 of FIG. 3A) length of about 3$\lambda$. SAMPLE 4 is a SAW device that includes a structure similar to the SAW structure 44 of FIG. 3B with an IDT (e.g., 26 of FIG. 3B) length of about 112$\lambda$ and a reflective structure (e.g., 46-1, 46-2 of FIG. 3B) length of about 3$\lambda$. In this manner, SAMPLE 1 includes the IDT in between conventional reflective gratings, SAMPLE 2 illustrates the performance impact of reducing the length of conventional gratings, SAMPLE 3 includes the IDT in between reflective IDTs, and SAMPLE 4 illustrates the performance impact when adjacent IDTs are in phase with the IDT. The amplitude in decibels (dB) of admittance for each of the samples is plotted with respect to the frequency of an alternating electrical input signal. Notably, all four samples have a similar series resonant frequency ($f_s$), or resonant frequency. The series resonant frequency represents the frequency where impedance is minimal. Differences between the four samples are more prominent at a parallel resonant frequency ($f_p$), or antiresonant frequency. The parallel resonant frequency represents the frequency where impedance is highest. FIG. 4B illustrates a magnified view of the dashed box of FIG. 4A where the parallel resonant frequencies of each of the samples differ. As illustrated, when the length of conventional gratings are reduced from a value of 14$\lambda$ for SAMPLE 1 to a value of 3$\lambda$ for SAMPLE 2, the parallel resonant frequency has a higher dB value which indicates the conventional gratings are less reflective with decreased length and therefore have a negative impact on the Q factor. In contrast, the parallel resonant frequency for SAMPLE 3 has a similar dB value to SAMPLE 1, indicating a similar reflectance performance and without a negative impact on the Q factor. The parallel resonant frequency for SAMPLE 3 does show a minor shift in frequency which indicates the reflective IDT structures of SAMPLE 3 have a minor coupling impact on bandwidth. This may be due to a minor increase in static capacitance as the reflective structure (e.g., 38-1, 38-2 of FIG. 3A) may also function as an IDT capacitor. SAMPLE 4 illustrates the largest change in the dB value at the parallel resonant frequency demonstrating the worst reflectance performance and largest impact on the Q factor.

SAW devices according to embodiments disclosed herein may be incorporated within larger devices and systems to provide simplified layouts or topologies. FIGS. 5A, 5B, 6A, and 6B illustrate representative radio frequency (RF) duplexing devices with various SAW devices as disclosed herein. RF duplexing devices typically are configured to receive signals and transmit signals of a different band using a common antenna. One of the primary challenges of duplexing is that RF transmission signals and RF receive signals can interfere with one another and accordingly, RF duplexing devices may employ one or more filters to improve isolation.

Figure 5A:
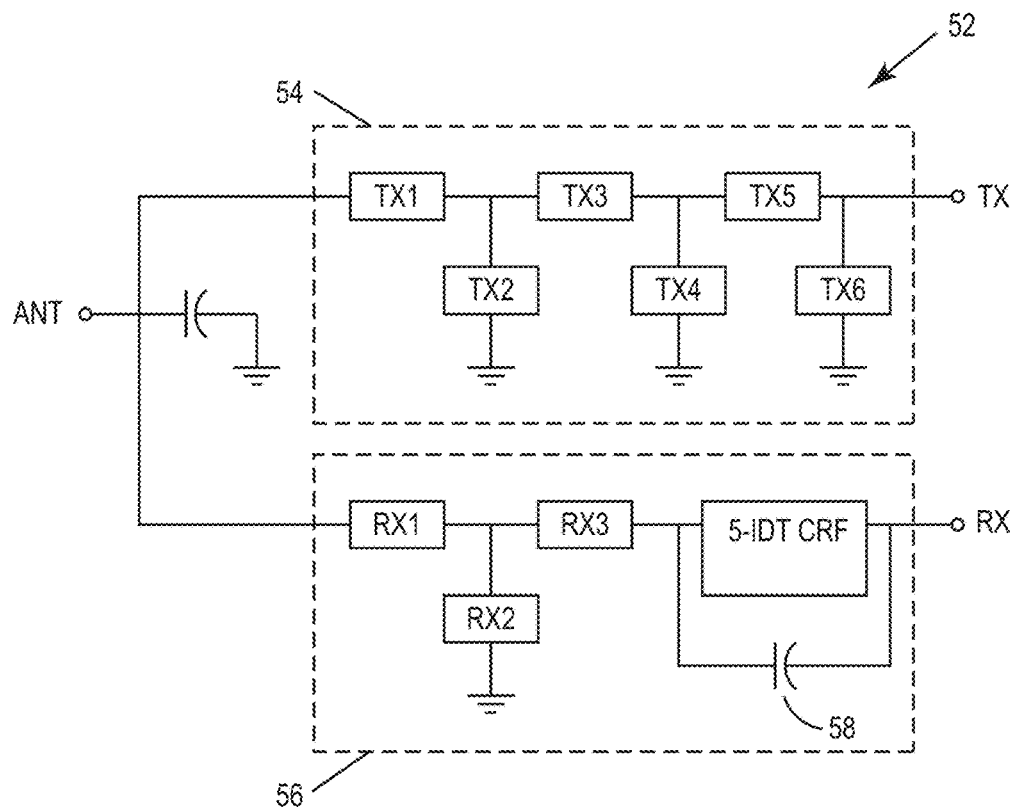
FIG. 5A is a block diagram of a radio frequency (RF) duplexer that includes conventional SAW resonators.
Figure 5B:
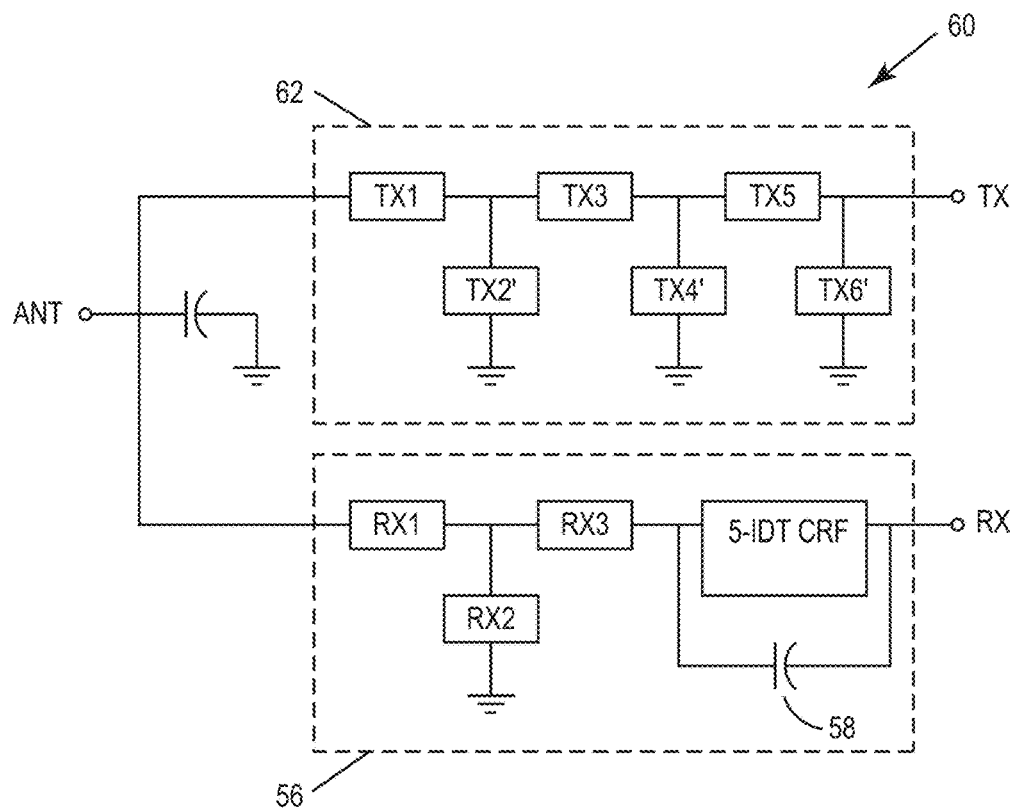
FIG. 5B is a block diagram of an RF duplexer that includes SAW resonators according to embodiments disclosed herein.

FIG. 5A is a block diagram of an RF duplexer 52 that includes conventional SAW resonators. The RF duplexer 52 includes a transmit (TX) port, a receive (RX) port, and an antenna (ANT) port. A TX filter 54 is positioned between the TX port and the antenna port, and an RX filter 56 is positioned between the RX port and the antenna port. The TX filter 54 is configured as a ladder filter with series resonators TX1, TX3, TX5 and shunt resonators TX2, TX4, TX6, all of which may be configured with a structure similar to the SAW structure 24 of FIG. 2A. The RX filter 56 includes series resonators RX1, RX3, a shunt resonator RX2, a SAW coupled resonator filter (CRF) structure (5-IDT CRF) that includes five IDTs that alternate between input IDTs and output IDTs, and a capacitor 58 that is connected between the input and output of the 5-IDT CRF. FIG. 5B is a block diagram of an RF duplexer 60 that includes SAW resonators according to embodiments disclosed herein. The RF duplexer 60 includes the same RX filter 54 of FIG. 5A between the TX port and the antenna port, but a different TX filter 62. In particular, the TX filter 62 includes shunt resonators TX2', TX4', TX6' that are configured with a structure similar to the SAW structure 36 of FIG. 3A. In this regard, the shunt resonators TX2', TX4', TX6' are configured with reflective IDTs that provide reduced die size without significant loss of performance.

Figure 6A:
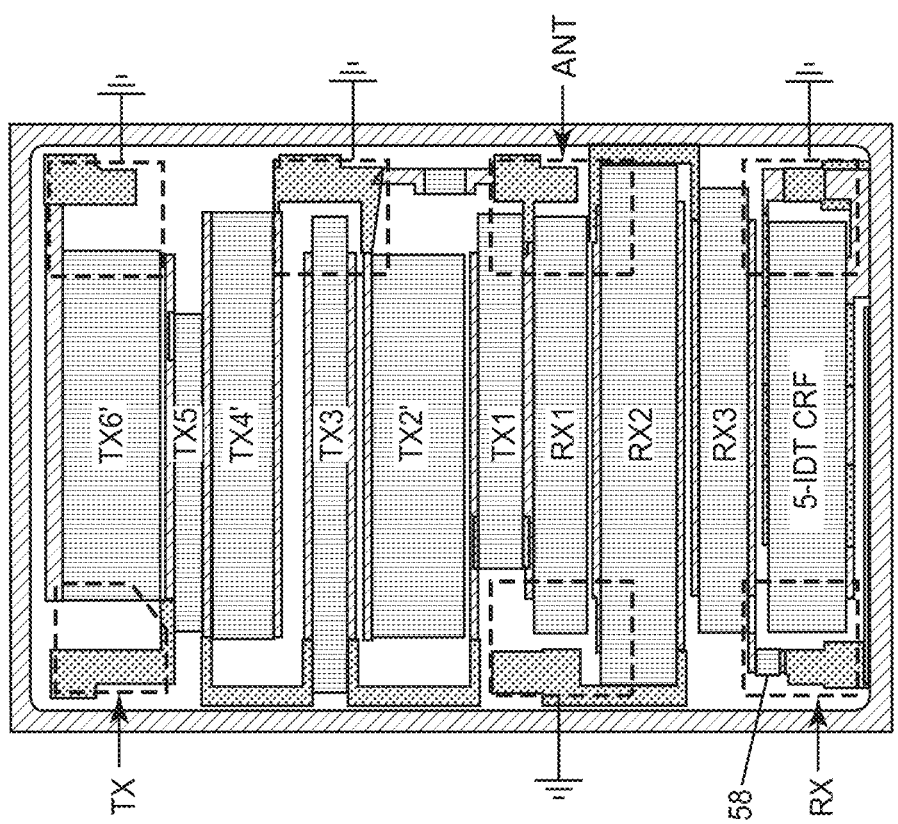
FIG. 6A is a top view of a device layout of the RF duplexer of FIG. 5A.
Figure 6B:
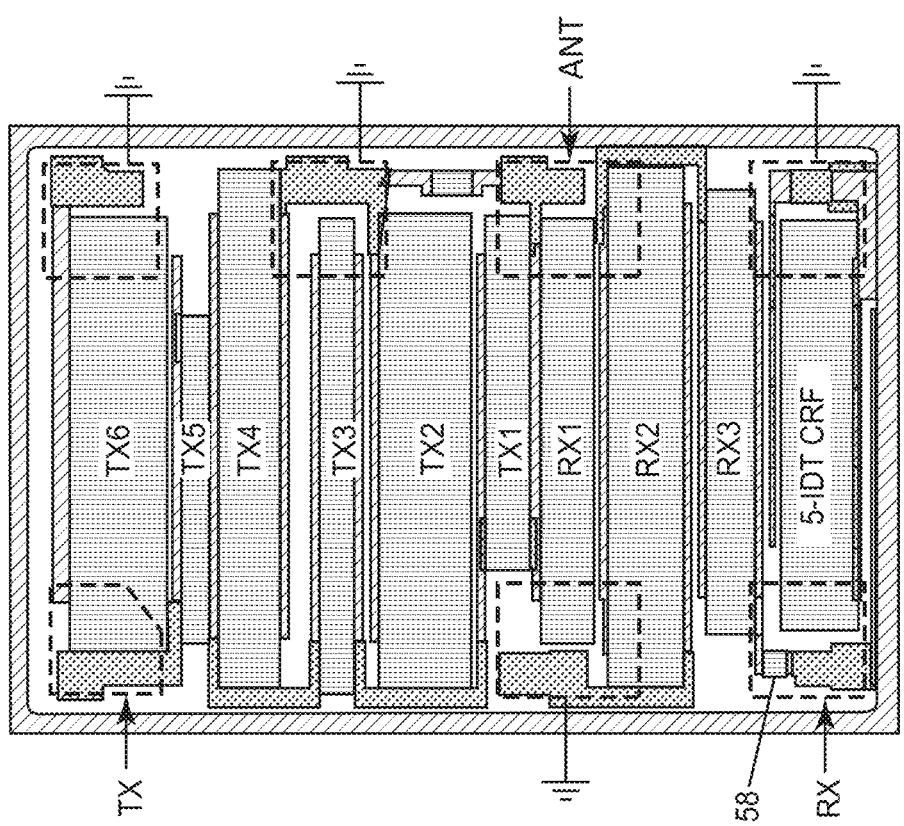
FIG. 6B is a top view of a device layout of the RF duplexer of FIG. 5B.

FIG. 6A is a top view of a device layout of the RF duplexer 52 of FIG. 5A. As illustrated, the RF duplexer 52 includes the resonators TX1 to TX6, the resonators RX1 to RX3, the 5-IDT CRF, and the capacitor 58 as previously described as well as areas for RX, TX, antenna, and various ground connections. FIG. 6B is a top view of a device layout of the RF duplexer 60 of FIG. 5B. As illustrated, the RF duplexer 60 includes the resonators TX2', TX4', TX6' in addition to the resonators TX1, TX3, TX5, the resonators RX1 to RX2, and the 5-IDT CRF, and the capacitor 58 as previously described as well as areas for RX, TX, antenna, and various ground connections. Due to the configuration of the resonators TX2', TX4', TX6' there is noticeably improved die space savings in these areas.

FIG. 7A is a top view illustration of the TX2 resonator of FIGS. 5A and 6A, and FIG. 7B is a top view illustration of the TX2' resonator of FIGS. 5B and 6B. In a non-limiting example, the TX2 resonator comprises a length 64 of about 716.6 microns (μm) and a width 66 of about 141.2 μm while the TX2' resonator comprises a length 68 of about 611.6 μm and a width 70 of about 141.2 μm. The size reduction from the length 64 of the TX2 resonator to the length 68 of the TX2' resonator is due to replacing conventional grating reflectors with reflective IDTs as previously described. In this manner, the TX2' resonator demonstrates about a 14.65% reduction in die area. FIG. 7C is a top view illustration of the TX4 resonator of FIGS. 5A and 6A, and FIG. 7D is a top view illustration of the TX4' resonator of FIGS. 5B and 6B. In a non-limiting example, the TX4 resonator comprises a length 72 of about 777.7 µm and a width 74 of about 93.9 µm while the TX4' resonator comprises a length 76 of about 683.5 µm and a width 78 of about 93.9 µm. In this manner, the TX4' resonator demonstrates about a 12.11% reduction in die area. FIG. 7E is a top view illustration of the TX6 resonator of FIGS. 5A and 6A, and FIG. 7F is a top view illustration of the TX6' resonator of FIGS. 5B and 6B. In a non-limiting example, the TX6 resonator comprises a length 80 of about 652.8 µm and a width 82 of about 149.6 µm while the TX6' resonator comprises a length 84 of about 555.1 µm and a width 86 of about 149.6 µm. In this manner, the TX6' resonator demonstrates about a 14.966% reduction in die area. While the specific dimensions listed above are provided, relative resonator sizes may be dependent on the target frequency band that a specific resonator is configured to operate. In this regard, replacing conventional grating reflectors with IDT reflectors as described herein can save significant die area in SAW resonators configured for various operating bands.

Figure 8A:
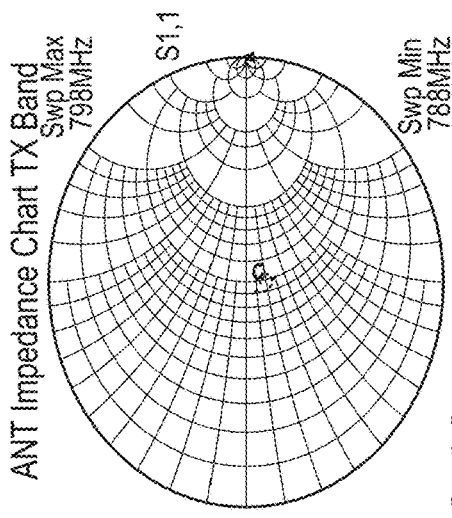
FIG. 8A is an S-parameters comparison plot representing passbands of the RF duplexer of FIGS. 5A/6A with the RF duplexer of FIGS. 5B/6B.
Figure 8B:
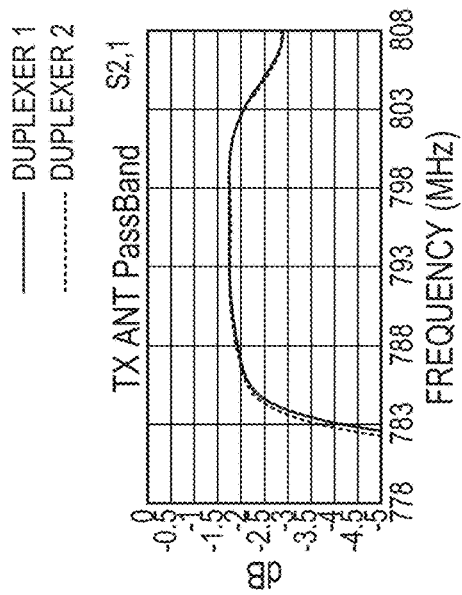
FIG. 8B is magnified view of frequency range from the S-parameters comparison plot representing passbands.
Figure 8C:
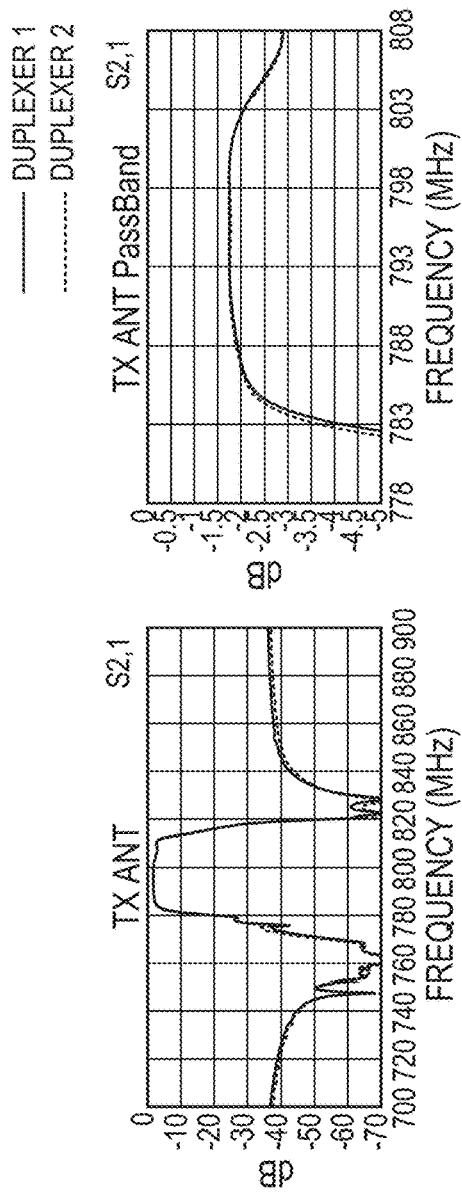
FIG. 8C is a Smith chart comparing the antenna reflection impendence of the RF duplexer of FIGS. 5A/6A with the RF duplexer of FIGS. 5B/6B.
Figure 8D:
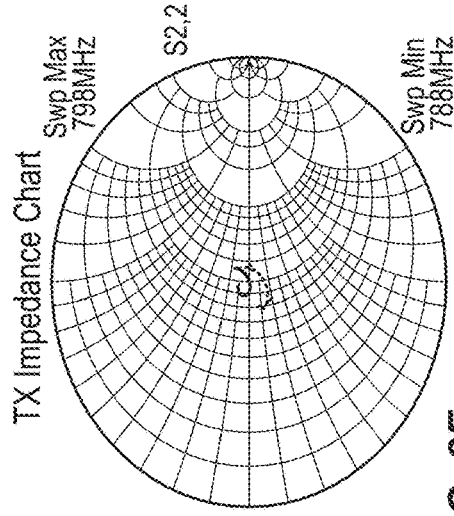
FIG. 8D is an S-parameters comparison plot representing a zoomed out view of the passbands of the RF duplexer of FIGS. 5A/6A with the RF duplexer of FIGS. 5B/6B.
Figure 8E:
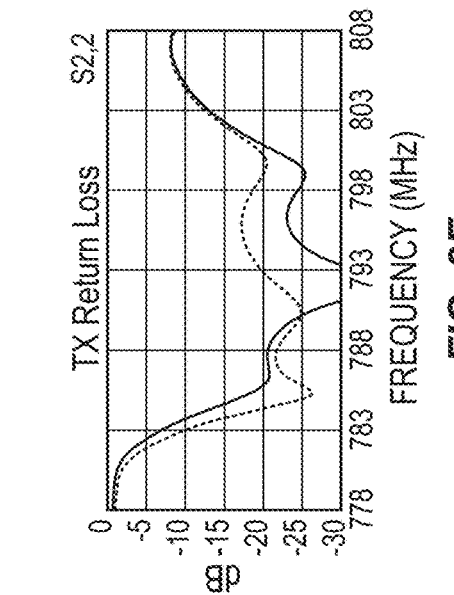
FIG. 8E is an S-parameters plot comparing return loss of the RF duplexer of FIGS. 5A/6A with the RF duplexer of FIGS. 5B/6B.
Figure 8F:
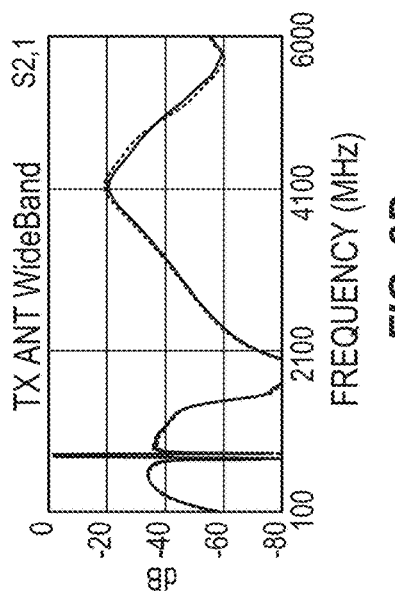
FIG. 8F is a Smith chart comparing the TX impendence for the transmit (TX) passband of the RF duplexer of FIGS. 5A/6A with the RF duplexer of FIGS. 5B/6B.
Figures 8G, 8H, 8I:
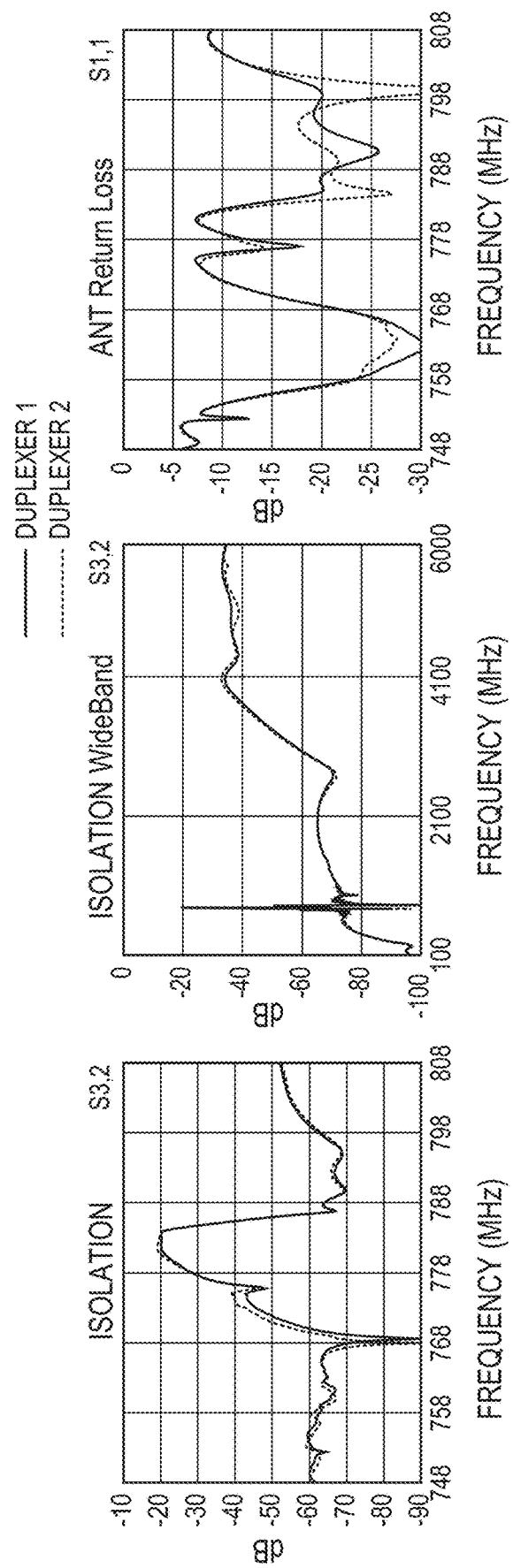
FIG. 8G is a comparison plot for duplexer isolation of the RF duplexer of FIGS. 5A/6A with the RF duplexer of FIGS. 5B/6B.
FIG. 8H is a zoomed out view of the comparison plot of FIG. 8G.
FIG. 8I is an S-parameters plot comparing antenna return loss of the RF duplexer of FIGS. 5A/6A with the RF duplexer of FIGS. 5B/6B.

FIGS. 8A to 8I are simulation plots comparing the performance of the RF duplexer 52 of FIGS. 5A/6A with the RF duplexer 60 of FIGS. 5B/6B. In FIGS. 8A to 8I, Duplexer 1 refers to the RF duplexer 52 of FIGS. 5A/6A and Duplexer 2 refers to the RF duplexer 60 of FIGS. 5B/6B. The performance comparisons of Duplexer 1 and Duplexer 2 are useful to demonstrate that SAW devices, and in particular SAW resonators, as disclosed herein may have reduced die size without a significant impact on device performance. FIG. 8A is an S-parameters comparison plot representing passbands of Duplexer 1 and Duplexer 2. The S-parameter magnitude is plotted in decibels (dB) across a megahertz (MHz) frequency range. Insertion loss, or S2,1, is an indication of how much power is transferred between the TX port and the antenna port. For frequencies where S2,1 is at or near 0 dB, then substantially all power from a signal is transferred. Accordingly, a TX passband is illustrated where the S2,1 values are at or near 0 dB. On either side of the TX passband, or the shoulder regions, the S2,1 values decrease rapidly. As the S2,1 value becomes farther away from 0 dB, more and more power is rejected. As illustrated, the TX passbands for Duplexer 1 and Duplexer 2 are substantially the same. FIG. 8B is an S-parameters comparison plot representing a magnified view of the TX passbands of FIG. 8A. In FIG. 8B, the comparison plot highlights the frequency range of 778 MHz to 808 MHz from FIG. 8A. FIG. 8C is a Smith chart comparing the antenna reflection impedance for the TX passband of Duplexer 1 and Duplexer 2. The chart illustrates the reflection scattering parameter (S1,1) at the antenna port in the TX passband frequency. Values at or near 1.0 in the center of the plot indicate the signal frequencies are passing through the TX filter 54. FIG. 8D is an S-parameters comparison plot representing a zoomed out view of the TX passbands of FIG. 8A. In FIG. 8D, the comparison plot illustrates a large frequency range from 100 MHz to 6000 MHz to show a similar rejection performance for frequencies well outside of the TX passbands. FIG. 8E is an S-parameters plot comparing return loss of Duplexer 1 and Duplexer 2. Return loss is an indication of voltage reflection, and S2,2 represents how much power is reflected at the TX port. For frequencies where S2,2 is at or near 0 dB, then substantially all power from a signal is reflected by the TX filter 54. FIG. 8F is a Smith chart comparing the TX impendence for the TX passband of Duplexer 1 and Duplexer 2. The chart illustrates the reflection scattering parameter (S2,2) at the RX port in the TX passband frequency. FIG. 8G is a comparison plot for duplexer isolation in dB for Duplexers 1 and 2, where a lower dB value indicates better isolation. S3,2 parameter values are plotted for Duplexers 1 and 2 to show isolation between the RX port and the TX port. S3,2 values in the frequency range of about 756 MHz to about 770 MHz indicate how much power may be leaking from the TX port to the RX port, and S3,2 values in the frequency range of about 786 MHz to about 800 MHz indicate how much power may be leaking from the RX port to the TX port. As illustrated, the dB values are at or near-60 dB for each of these frequency ranges, indicating good isolation and low power leakage. FIG. 8H is a zoomed out view of the comparison plot of FIG. 8G. In FIG. 8H, the comparison plot illustrates a large frequency range from 100 MHz to 6000 MHz to show a similar isolation performance for frequencies well outside of the TX passbands. FIG. 8I is an S-parameters plot comparing antenna return loss of Duplexer 1 and Duplexer 2. As illustrated, the antenna return loss, plotted as S1,1, is similar between Duplexer 1 and Duplexer 2.

Figure 9:
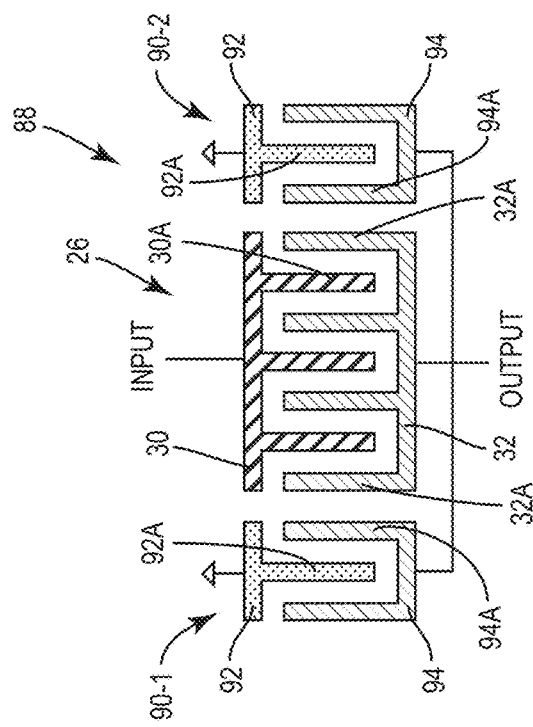
FIG. 9 illustrates a SAW structure that includes reflective structures that comprise reflective IDTs according to embodiments disclosed herein.

FIG. 9 illustrates a SAW structure 88 that includes reflective structures 90-1, 90-2 that comprise reflective IDTs according to embodiments disclosed herein. An optional substrate (e.g., 12 of FIG. 1) and/or piezoelectric layer or substrate (e.g., 14 of FIG. 1) are not shown, but may be provided to form a SAW device. In FIG. 9, the SAW structure 88 includes the IDT 26 with the first electrode 30 that is electrically connected to the input signal and the second electrode 32 that is electrically connected the output signal as previously described. The first electrode 30 comprises the plurality of first electrode fingers 30A that are interdigitated with the plurality of second electrode fingers 32A of the second electrode 32. In this manner the plurality of first electrode fingers 30A that are electrically connected to the input signal are alternated with the plurality of second electrode fingers 32A that are electrically connected to the output signal to generate acoustic waves in response to an electrical signal as previously described. As with previous embodiments, while only a certain number of the first and second electrode fingers 30A, 32A are illustrated, in practice the IDT 26 can include many more alternating first and second electrode fingers 30A, 32A. Each of the reflective structures 90-1, 90-2 comprises a first reflective electrode 92 that is electrically connected to ground and a second reflective electrode 94 that is electrically connected to the output signal. The first reflective electrode 92 includes one or more first reflective electrode fingers 92A and the second reflective electrode 94 includes one or more second reflective electrode fingers 94A. The one or more first reflective electrode fingers 92A are alternated or interdigitated with the one or more second reflective electrode fingers 94A to form reflective IDTs. As illustrated in FIG. 9, the reflective structures 90-1, 90-2 may be arranged on opposing sides of the IDT 26 such that an individual second reflective electrode finger 94A is arranged closest to an individual second electrode finger 32A of the IDT 26, both of which are electrically connected to the output signal. In this manner, the alternating arrangement of electrode fingers 30A, 32A is interrupted by the reflective IDTs of the reflective structures 90-1, 90-2. The reflective IDTs are thereby configured to have a phase difference, and in some embodiments be out of phase with the IDT 26 and accordingly, acoustic waves are reflected and confined within a resonant cavity that is formed between the reflective structures 90-1, 90-2 on the piezoelectric material. In other embodiments, the individual second reflective electrode finger 94A is arranged closest to the individual second electrode finger 32A, and both may be electrically connected to the input signal to form reflective IDTs as previously described. Additionally, as each reflective structure 90-1, 90-2 is electrically connected to ground and at least one of the input signal or the output signal, the reflective structures 90-1, 90-2 may also serve as IDT capacitors that may alter the overall static capacitance.

Figure 10:
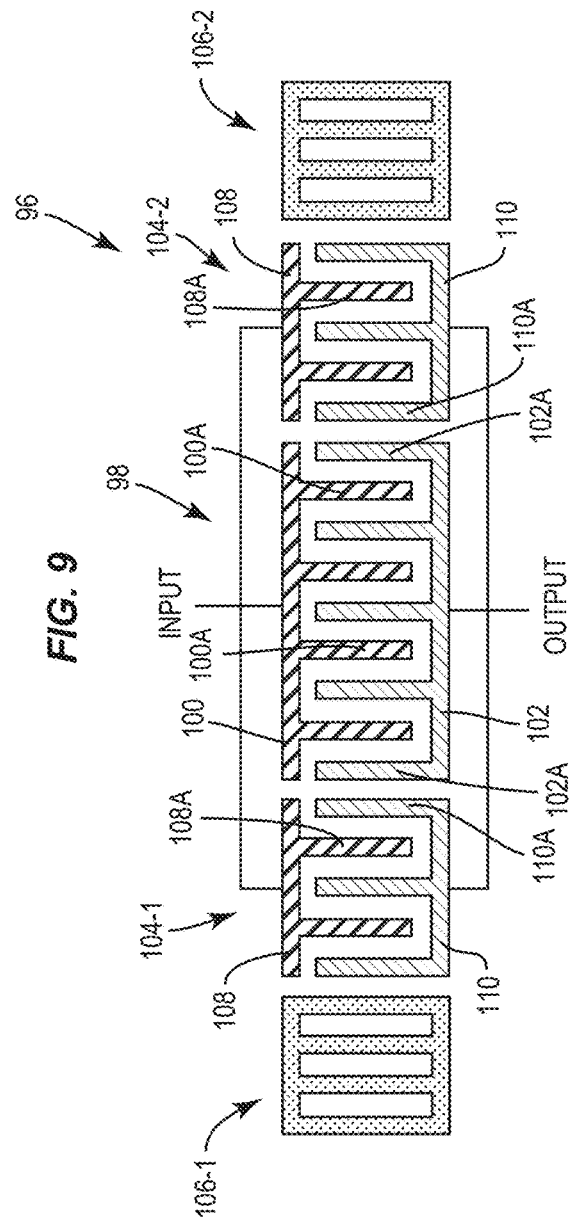
FIG. 10 illustrates a SAW structure that includes an IDT that is arranged between multiple reflective structures according to embodiments disclosed herein.

FIG. 10 illustrates a SAW structure 96 that includes an IDT 98 that is arranged between multiple reflective structures according to embodiments disclosed herein. An optional substrate (e.g., 12 of FIG. 1) and/or piezoelectric layer or substrate (e.g., 14 of FIG. 1) are not shown, but may be provided to form a SAW device. In FIG. 10, the SAW structure 98 includes the IDT 98 with a first electrode 100 that is electrically connected to the input signal and a second electrode 102 that is electrically connected to the output signal as previously described. The first electrode 100 comprises a plurality of first electrode fingers 100A that are interdigitated with a plurality of second electrode fingers 102A of the second electrode 102. In this manner the plurality of first electrode fingers 100A that are electrically connected to the input signal are alternated with the plurality of second electrode fingers 102A that are electrically connected to the output signal to generate acoustic waves in response to an electrical signal as previously described. As with previous embodiments, while only a certain number of first and second electrode fingers 100A, 102A are illustrated, in practice the IDT 98 can include many more alternating first and second electrode fingers 100A, 102A. In addition to first and second reflective structures 104-1, 104-2, additional reflective structure 106-1, 106-2 are arranged on either side of the IDT 98. Each of the first and second reflective structures 104-1, 104-2 comprises a first reflective electrode 108 that is electrically connected to the input signal and a second reflective electrode 110 that is electrically connected to the output signal. In other embodiments, at least one of the first reflective electrode 108 and the second reflective electrode 110 may be electrically connected to ground while the other of the first reflective electrode 108 and the second reflective electrode 110 may be electrically connected to either the input signal or the output signal. The first reflective electrode 108 includes one or more first reflective electrode fingers 108A that are alternated or interdigitated with one or more second reflective electrode fingers 110A of the second reflective electrode 110 to form reflective IDTs as previously described. An individual second reflective electrode finger 110A is arranged closest to an individual second electrode finger 102A of the IDT 98 and both are electrically connected to the output signal, or the input signal in other embodiments. In this regard, the reflective structures 104-1, 104-2 form reflective IDTs that have a phase difference with the IDT 98, and acoustic waves may be reflected and confined within a resonant cavity that is formed between the first and second reflective structures 104-1, 104-2 on the piezoelectric material. In certain embodiments, the reflective IDTs are out of phase with the IDT 98. The additional reflective structures 106-1, 106-2 are configured as reflective gratings to further reflect and confine acoustic waves within the resonant cavity. As illustrated in FIG. 10, the reflective structures 104-1, 104-2 are configured between the additional reflective structures 106-1, 106-2 and the IDT 98. In other embodiments, the order may be reversed such that the additional reflective structures 106-1, 106-2 are configured between the reflective structures 104-1, 104-2 and the IDT 98.

Figure 11:
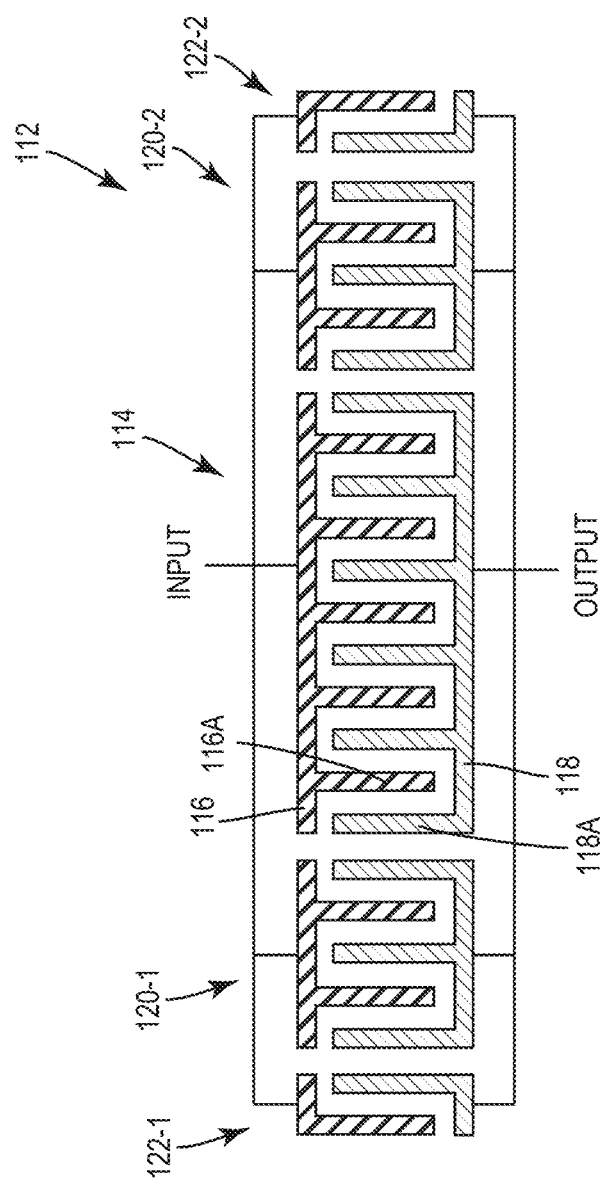
FIG. 11 illustrates a SAW structure that includes an IDT that is arranged between multiple reflective IDTs according to embodiments disclosed herein.

FIG. 11 illustrates a SAW structure 112 that includes an IDT 114 that is arranged between multiple reflective IDTs according to embodiments disclosed herein. An optional substrate (e.g., 12 of FIG. 1) and/or piezoelectric layer or substrate (e.g., 14 of FIG. 1) are not shown, but may be provided to form a SAW device. In FIG. 11, the SAW structure 112 includes the IDT 114 with a first electrode 116 that is electrically connected to the input signal and a second electrode 118 that is electrically connected the output signal as previously described. The first electrode 116 comprises a plurality of first electrode fingers 116A that are interdigitated with a plurality of second electrode fingers 118A of the second electrode 118. In this manner the plurality of first electrode fingers 116A that are electrically connected to the input signal are alternated with the plurality of second electrode fingers 118A that are electrically connected to the output signal to generate acoustic waves in response to an electrical signal as previously described. As with previous embodiments, while only a certain number of the first and second electrode fingers 116A, 1118A are illustrated, in practice the IDT 114 can include many more alternating first and second electrode fingers 116A, 118A. First reflective structures 120-1, 120-2 and second reflective structures 122-1, 122-2 are arranged on either side of the IDT 114. In certain embodiments, each of the first reflective structures 120-1, 120-2 is arranged between the second reflective structures 122-1, 122-2. As illustrated in FIG. 11, the first reflective structures 120-1, 120-2 and the second reflective structures 122-1, 122-2 are configured as reflective IDTs that are have a phase difference with the IDT 114 to reflect and confine acoustic waves as previously described. In certain embodiments, the reflective IDTs are out of phase with the IDT 114. In certain embodiments, the first reflective structures 120-1, 120-2 and the second reflective structures 122-1, 122-2 are each electrically connected to both the input signal and the output signal. In other embodiments, the first reflective structures 120-1, 120-2 and the second reflective structures 122-1, 122-2 may each be electrically connected to ground and either the input signal or the output signal. The first reflective structures 120-1, 120-2 and the second reflective structures 122-1, 122-2 may be configured to reflect different frequency bands and may comprise different numbers of alternating electrodes fingers. In further embodiments, the SAW structure 112 may comprise additional reflective structures, including reflective IDTs and reflective gratings to further reflect and confine acoustic waves.

For simplicity, all of the embodiments disclosed herein are illustrated with unapodized IDTs where all of the IDT electrode fingers have a uniform length. In certain embodiments, one or more of the IDTs and reflective IDTs as previously described may comprise an apodized IDT where electrode fingers have different lengths at different positions along the apodized IDT that are configured for a particular response function. In certain embodiments, one or more of the IDTs as previously described may comprise a metallization ratio, or duty factor, of any range between 0 and 1 of a center wavelength A. In certain embodiments, the metallization ration is in a range of about 0.1 to about 0.9; or in a range of about 0.2 to about 0.8; or in a range of about 0.3 to about 0.7; or in a range of about 0.4 to about 0.5. In certain embodiments, the metallization ratio comprises a value of about 0.4, or a value of about 0.5.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) duplexer comprising:
a receive port, a transmit port, and an antenna port; and a plurality of surface acoustic wave (SAW) devices, wherein at least one SAW device of the plurality of SAW devices comprises:
a piezoelectric material;
an interdigital transducer (IDT) on the piezoelectric material; and
a first reflective IDT and a second reflective IDT on the piezoelectric material,
wherein the IDT is arranged between the first reflective IDT and the second reflective IDT to form a resonant cavity that is bounded by the first reflective IDT and the second reflective IDT.

2. The RF duplexer of claim 1, wherein the plurality of SAW devices form part of a transmit filter that is between the transmit port and the antenna port.

3. The RF duplexer of claim 2, wherein the transmit filter comprises a ladder filter where certain SAW devices of the plurality of SAW are devices arranged as series resonators and other SAW devices of the plurality of SAW devices are arranged as shunt resonators.

4. The RF duplexer of claim 3, further comprising a receive filter positioned between the receive port and the antenna port.

5. The RF duplexer of claim 1, wherein the first reflective IDT and the second reflective IDT are configured to have a phase difference with the IDT.

6. The RF duplexer of claim 1, wherein the first reflective IDT and the second reflective IDT are electrically connected to an input signal and an output signal for the at least one SAW device.

7. The RF duplexer of claim 1, wherein the first reflective IDT and the second reflective IDT are electrically connected to ground and either an input signal or an output signal for the at least one SAW device.

8. The RF duplexer of claim 1, wherein:
the IDT comprises a plurality of first electrode fingers that are electrically connected to an input signal for the at least one SAW device and a plurality of second electrode fingers that are electrically connected to an output signal for the at least one SAW device, and the plurality of first electrode fingers are interdigitated with the plurality of second electrode fingers; and
the first reflective IDT comprises one or more first reflective electrode fingers that are electrically connected to the input signal and one or more second reflective electrode fingers that are electrically connected to the output signal.

9. The RF duplexer of claim 8, wherein the one or more first reflective electrode fingers are interdigitated with the one or more second reflective electrode fingers.

10. The RF duplexer of claim 1, wherein:
a reflective electrode finger of the first reflective IDT is arranged closer to the IDT than any other portion of the first reflective IDT;
an electrode finger of the IDT is arranged closer to the first reflective IDT than any other portion of the IDT; and
the reflective electrode finger and the electrode finger are both electrically connected to the same of either an input signal or an output signal for the at least one SAW device.

11. The RF duplexer of claim 1, further comprising additional reflective structures, wherein the first reflective IDT and the second reflective IDT are configured between the additional reflective structures and the IDT.

12. The RF duplexer of claim 1, wherein at least one of the IDT, the first reflective IDT, and the second reflective IDT comprises an apodized IDT.

13. A method for forming a surface acoustic wave (SAW) device comprising:
forming an interdigital transducer (IDT) on a piezoelectric material, the IDT being arranged for being electrically connected between an input signal and an output signal; and
forming a first reflective IDT and a second reflective IDT on the piezoelectric material such that the IDT is arranged between the first reflective IDT and the second reflective IDT to form a resonant cavity that is bounded by the first reflective IDT and the second reflective IDT.

14. The method of claim 13, wherein the first reflective IDT and the second reflective IDT are configured to have a phase difference with the IDT.

15. The method of claim 13, wherein the first reflective IDT and the second reflective IDT are configured for being electrically connected to the input signal and the output signal.

16. The method of claim 13, wherein the first reflective IDT and the second reflective IDT are configured for being electrically connected to ground and either the input signal or the output signal.

17. The method of claim 13, wherein at least one of the IDT, the first reflective IDT, and the second reflective IDT comprises an apodized IDT.

18. A wireless device comprising:
one or more surface acoustic wave (SAW) devices, wherein the one or more SAW devices comprises:
a piezoelectric material;
an interdigital transducer (IDT) on the piezoelectric material; and
a first reflective IDT and a second reflective IDT on the piezoelectric material, wherein the IDT is arranged between the first reflective IDT and the second reflective IDT to form a resonant cavity that is bounded by the first reflective IDT and the second reflective IDT.

19. The wireless device of claim 18, wherein the first reflective IDT and the second reflective IDT are configured to have a phase difference with the IDT.

20. The wireless device of claim 18, wherein at least one of the IDT, the first reflective IDT, and the second reflective IDT comprises an apodized IDT.

21. The wireless device of claim 18, further comprising a radio frequency (RF) duplexer, wherein the RF duplexer comprises the one or more SAW devices.

* * * * *